United States Patent [19]

Nishizawa et al.

[11] Patent Number: 4,725,873
[45] Date of Patent: * Feb. 16, 1988

[54] SEMICONDUCTOR IMAGING DEVICE

[75] Inventors: Junichi Nishizawa, No. 6-16, Komegafukuro 1-chome, Sendai-shi, Miyagi; Takashige Tamamushi; Sobei Suzuki, both of Miyagi, all of Japan

[73] Assignee: Junichi Nishizawa, Miyagi, Japan

[*] Notice: The portion of the term of this patent subsequent to Feb. 16, 2005 has been disclaimed.

[21] Appl. No.: 882,456

[22] Filed: Jul. 8, 1986

Related U.S. Application Data

[63] Continuation of Ser. No. 782,183, Sep. 30, 1985, abandoned, which is a continuation of Ser. No. 561,111, Dec. 13, 1983, abandoned.

[30] Foreign Application Priority Data

Dec. 13, 1982 [JP] Japan ................................ 57-218592

[51] Int. Cl.$^4$ ......................... H01L 27/14; H04N 3/14
[52] U.S. Cl. ......................................... 357/30; 357/22
[58] Field of Search ...................... 357/30, 22 B, 22 D, 357/30 H, 30 I, 30 R; 358/212, 213.12

[56] References Cited

U.S. PATENT DOCUMENTS 4,122,483 10/1978 Hulstrunk .............................. 357/53
4,250,519 2/1981 Mogi et al. ............................. 357/55
4,427,990 1/1984 Nishizawa .............................. 357/52

FOREIGN PATENT DOCUMENTS 0105672 6/1983 Japan ....................................... 357/30

Primary Examiner—James W. Davie
Attorney, Agent, or Firm—Sughrue, Mion, Zinn, Macpeak & Seas

[57] ABSTRACT

A semiconductor imaging device composed of a matrix of pixels, each pixel being implemented with a single static induction transistor. Each static induction transistor includes a pair of principal electrode regions disposed facing each other through a highly resistive channel region. First and second gate regions of the conduction type opposite that of the principal electrode regions is formed in contact with the channel region and used to control the current flow between the two principal electrode regions. A capacitor is formed on at least part of the first gate region, whereby carriers generated by light exitation are stored in the first gate region. The second gate region is formed surrounding the first gate region and is common to all pixels. This construction provides a high-level output signal and good isolation between pixels, with an attendant increase in blooming resistance.

5 Claims, 12 Drawing Figures

SEMICONDUCTOR IMAGING DEVICE

This is a continuation of application Ser. No. 782,183 filed Sept. 30, 1985, abandoned, which is a continuation of application Ser. No. 561,111 filed Dec. 13, 1983, abandoned.

BACKGROUND OF THE INVENTION

The present invention relates to a semiconductor imaging device. More particularly, the invention relates to a semiconductor imaging device composed of an array or one-dimensional arrangement of pixels, each constituted by an SIT (Static Inductive Transistor) having both light-detecting and switching capabilities.

A conventional semiconductor imaging device includes an array of pixels, each composed of a light-detecting diode and a switching transistor. With such a pixel, the light signal detected by the diode is coupled through the switching transistor to provide an output signal. The output signal level and the device sensitivity with this arrangement are low. This low sensitivity puts a limit on the number of pixels that can be packed in the imaging device.

The present inventors have previously disclosed semiconductor imaging devices that use an SIT as a light-detecting device. (See Japanese Patent Application Nos. 204656/81 and 157693/82). In these devices, a light signal is stored in the gate region of a transistor having a high sensitivity to light, and a video signal is derived by controlling the current flowing between the source and drain according to the potential at the gate region. These devices are characterized by a high signal output.

One object of the present invention is to provide an improved semiconductor imaging device that produces a high output signal and provides good isolation between pixels, with an attendant increase in resistance to blooming.

Another object of the invention is to provide a semiconductor imaging device in which an increased number of pixels can be packed in a single imaging device due to individual pixels being isolated by a simple structure without requiring a large space for isolation.

SUMMARY OF THE INVENTION

The above and other objects of the invention are met by a semiconductor imaging device composed of a plurality of pixels each constructed with a single static induction transistor. Each static induction transistor includes a pair of principal electrode regions of one conduction type facing one another through a high resistivity channel region, first and second gate regions of the other conduction type formed in contact with the channel region and which control the current flow between the two principal electrode regions, and a capacitor formed on at least part of the first gate region such that carriers generated by light excitation are stored in the first gate region. In accordance with the invention, the second gate region is formed surrounding the first gate region. Further, the second gate region is common to all pixels.

DESCRIPTION OF THE PREFERRED EMBODIMENTS

Figure 1:
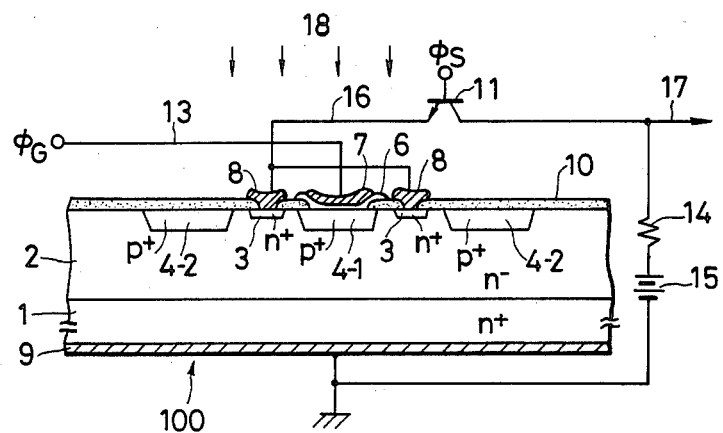
FIGS. 1, 2 and 10 show in cross section essential parts of three different embodiments of a pixel used in a semiconductor imaging device of the present invention.
Figure 2:
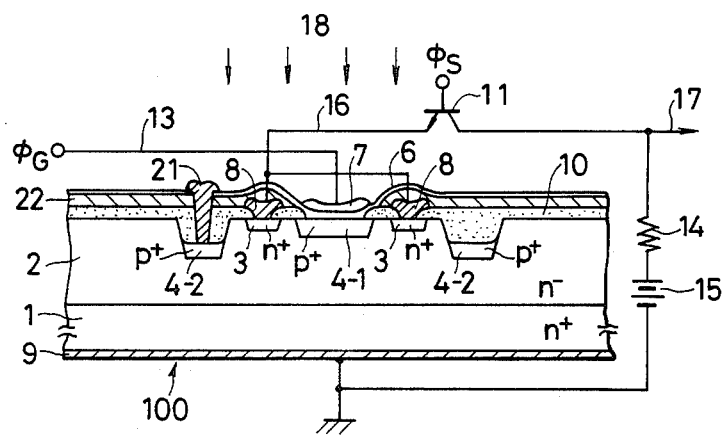

Two preferred embodiments of a pixel that can be used in a semiconductor imaging device of the present invention are shown in cross section in FIGS. 1 and 2, wherein 1 is an n+ Si substrate, 2 is a highly resistive n− or intrisic semiconductor region that is used to form a channel; 3 is an n+ drain region having a high impurity concentrations; 4-1 and 4-2 are p+ control and shielding gate regions having a high impurity concentration and which are so configured that they do not completely cover the channel region; 6 is an insulating film that forms a capacitor on the control gate region and which is typically made of $SiO_2$ or $Si_3N_4$; 7, 8 and 9 are respectively gate, drain and source electrodes, which at least the gate electrode 7 being transparent to incident light 18; and 10 is a surface protective film typically made of $SiO_2$.

Other numerals and symbols have the following meanings: 11 is a switching transistor, $\phi_S$ is a transistor control signal, 13 is a selection line over which a read pulse signal $\phi_G$ is applied to the gate electrode from a pixel selecting circuit (not shown), 14 is a load resistor, 15 is a video voltage source, 16 is a signal readout line, 17 is an output terminal, and 18 is incident light.

The p+ region 4-1 forms a control gate wherein photocarriers (holes in the embodiments shown) are stored and used to control the current flow between the drain and source. Above the control gate is formed a capacitor including the insulating film 6 as its dielectric and gate electrode 7 and the control gate 4-1 itself as its electrodes. The other p+ gate region 4-2 provides a shielding gate which surrounds the control gate 4-1 and the n+ drain region 3. The two gates 4-1 and 4-2 provides a potential barrier in the channel region 2. While only one pixel is shown in FIGS. 1 and 2, the shielding gate 4-2 has the function of isolating two adjacent pixels by a depletion layer. The shielding gate may be a floating region. Alternatively, it may be supplied with a certain potential through an electrode indicated at 21 in FIG. 2. If desired, the shielding gate may be grounded through a resistor.

The pixel shown in FIG. 2 differs from the device shown in FIG. 1 in that the shielding gate 4-2 in the former pixel is buried within the silicon substrate. The shielding gate of the buried type can be fabricated by various methods, for example by the LOCUS method wherein boron or other suitable impurity atoms are diffused deeply into the area of the substrate where the shielding gate is to be formed and thereafter the surface of the diffused layer is subjected to selective oxidation, or alternatively by a notching process wherein a notch is cut in the target area by, for example, plasma etching, with boron or other suitable impurity atoms diffused into the notch. If desired, an oxide layer may be formed in the upper part of the notch. As will be described below, better isolation between pixels and a greater resistance to blooming are achieved by forming the shielding gate 4-2 to a greater depth in the substrate than the control gate 4-1. In the arrangement of FIG. 2, an insulating layer 22, typically made of phosphosilicate glass and which isolates gate and drain electrodes 7 and 8, is shown, but this is omitted from FIG. 1 for the sake of clarity.

Figure 3:
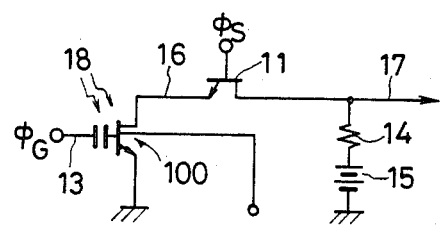
FIG. 3 shows an equivalent circuit for the pixel shown in the above figures.

The equivalent circuit of the pixel shown in FIGS. 1 and 2 is illustrated in FIG. 3. Upon illumination with light 18, holes are generated by light excitation and flow into the gate region 4-1 of an SIT (Static Induction Transistor) 100 to write an optical signal. A pulse of the signal $\phi_S$ is applied to the base (or gate) of the switching transistor 11 to turn it on, whereupon a bias voltage is applied across the drain and source of transistor 100 from the power supply 15. When a pulse of the signal $\phi_G$ is applied to the gate region 4-1, the transistor 100 turns on and a drain current flows in a magnitude determined by the intensity of the incident light 18, and a light signal is obtained at the output terminal 17 accordingly. This optical output varies with the intensity of incident light 18, and is characterized by an amplification gain of more than $10^3$, which is at least ten times as great as the gain achieved by the conventional bipolar transistor device. As a further advantage, the output signal obtained has a wide dynamic range. The control gate 4-1 is connected to a capacitor that stores an optical signal while blocking the passage of the d.c. component of the signal.

In order to fabricate an SIT having the configuration described above, the impurity concentration in the n⁻ channel region 2 should not exceed about $1 \times 10^{16}/cm^3$ whereas the impurity concentration in each of the gates 4-1 and 4-2, drain 3 and source 1 should exceed about $1 \times 10^{18}/cm^3$. In order to prevent the flow of a drain current when the gate voltage is zero, the dimensions and impurity concentration should be selected such that the diffusion potential alone is sufficient to form a depletion layer between the two gates and in the channel.

From a process viewpoint, a configuration having thicker gate regions and a smaller inter-gate spacing is far easier to fabricate. Since the SIT is designated to ahcieve a high amplification gain upon illumination with light, care must be taken so that no dislocations or other crystal defects will be introduced into the device during fabrication. If boron is diffused to form a p+ type gate, a suitable element of group IV of the atomic table should also be diffused for the purpose of compensating for any lattice deformation that might occur. The n⁻ channel region 2 must present an environment where electron-hole pairs generated by light excitation have a long lifetime and will not easily recombine. To satisfy this requirement, a getter that traps heavy metals is preferably introduced into the channel in the final step of the fabrication process.

Figure 4:
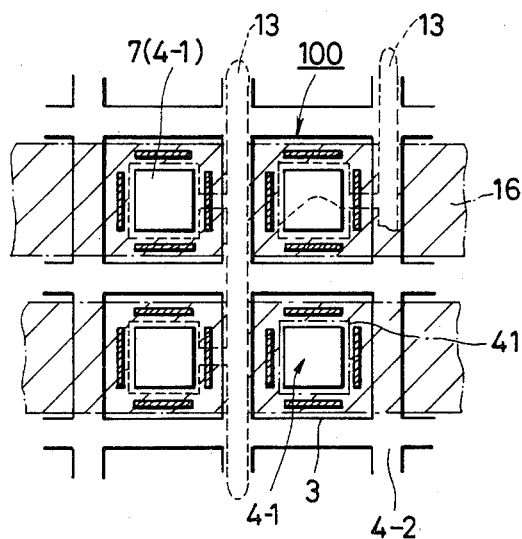
FIG. 4 is a plan view of pixels as arranged in an array.

Pixel units as shown in FIGS. 1 to 3 are arranged as shown in the plan view of FIG. 4, wherein each pixel, generally indicated at 100, has a control gate 4-1 surrounded by the shielding gate 4-2 to define a channel region, the latter having formed therein a drain region 3 providing one principal electrode for the pixel. With this arrangement, photocarriers stored in the control gate 4-1 cannot easily flow out of the control gate because of the pressure of the n+ drain 3 that surrounds it. In other words, the drain region 3 serves as a barrier against the leakage of photocarriers. Therefore, when a voltage pulse is applied to the signal readout line 16 and selection line 13, current will flow between the drain and source in a magnitude determined by the amount of photocarriers stored in the control gate, and hence an output is obtained in a magnitude that varies with the magnitude of the optical input.

The effectiveness of the drain region 3 as a barrier can be increased by increasing its length per unit pixel, and at the same time, a greater output current can be obtained accordingly. Due to this fact, if the pixel is square in shape, a drain region is preferably provided on each of the four sides of the pixel. In this case, the four sides of the pixel may be completely surrounded by the drain region. However, the spacing between the control gate 4-1 and the shielding gate 4-2 at each corner of the pixel is greater than the spacing in other areas and permits an easier flow of current between the drain and source. Therefore, the drain region 3 is preferably provided in the area where the spacing between the two gates (4-1 and 4-2) is a minimum. In order to minimize the leakage current from the corners, it is preferred to form four drain regions which are slightly shorter than one side of the control gate and to dispose each of these drain regions within the length of one side of the control gate.

The shielding gate 4-2, together with the control gate 4-1, forms a potential barrier in the channel region. At the same time, the shielding gate provides electrical isolation between two adjacent pixels. The shielding gate also functions to prevent blooming by discharging excess photocarriers which are stored in the control gate 4-1 when it is illuminated with light in an amount producing saturation.

In order to accomplish these functions, the shielding gate 4-2 is formed around the control gate 4-1 with the drain region 3 interposed as shown in FIG. 4. The shielding gate is electrically common to the pixels 100 arranged in an array. More specifically, in the embodiment of FIG. 4, the shielding gate 4-2 is common to every two adjacent pixels 100 and is formed surrounding the control gate 4-1. Therefore, in the embodiment shown, the size of one unit of pixel 100 is defined by the center lines of two adjacent shielding gates.

Figure 5:
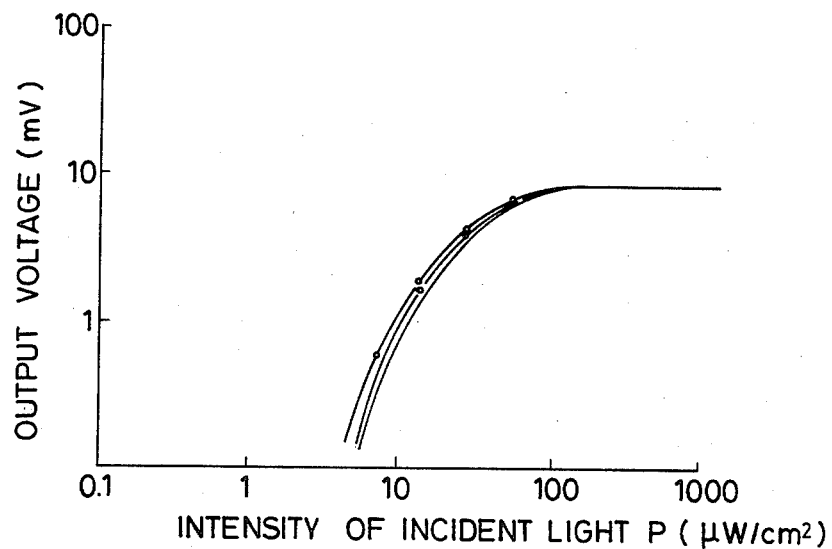
FIG. 5 is a graph showing the light intensity vs. output voltage characteristic of the pixel.
Figure 6:
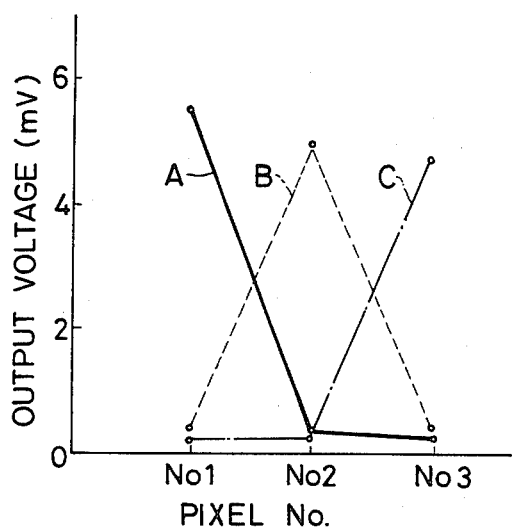
FIGS. 6 and 7 are graphs each comparing the light intensity vs. output voltage characteristic between a single illuminated pixel and an adjacent unilluminated pixel.
Figure 7:
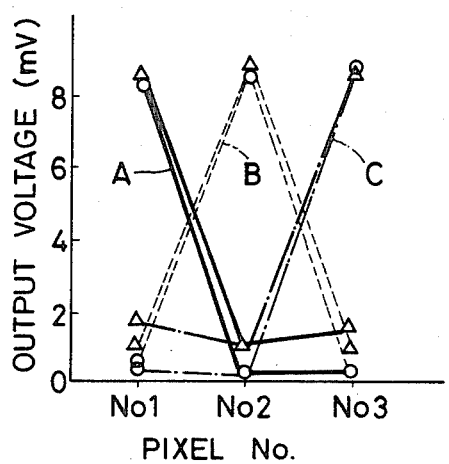

The shielding gate 4-2 that is common to a plurality of pixels 100 ensures good isolation between pixels, as will be apparent from FIGS. 5 to 7. FIG. 5 is a graph showing the typical optical response characteristic of the semiconductor imaging device of the present invention. More specifically, FIG. 5 shows the relationship between the intensity of incident light and output voltage when a semiconductor imaging device composed of a plurality of pixels having the configuration shown in FIG. 1 was illuminated with light and supplied with the $\phi_S$ and $\phi_G$ signals to produce an output signal. The measurement was conducted for three adjacent pixels arranged in an array. As is clear from FIG. 5, the increase in the intensity of incident light is accompanied by a corresponding increase in the output voltage. When the intensity of light is about 100 microwatts/$cm^2$, the output voltage reaches the saturation point. These characteristics are obviously improved over those of the conventional MOS type semiconductor imaging device whose output is saturated with an exposure of only about 10 microwatts/cm$^{-3}$.

FIG. 6 is a graph obtained by plotting the output voltages from three adjacent pixels in the array, each having the configuration shown in FIG. 1. In this test, the entire surface of each pixel was illuminated with light in a magnitude of less than the saturation exposure, but no adjacent pixel was illuminated when that specific pixel was under illumination. On the horizontal axis of the graph, the identification number of each pixel is indicated. Line A represents the output voltage obtained when only the first pixel was illuminated with light, line B shows the output voltage obtained when only the second pixel was illuminated, and line C refers to the output voltage obtained when only the third pixel was illuminated. In the semiconductor imaging device of the present invention, the shielding gate 4-2 is common to a plurality of pixels, but since it is formed around the control gate 4-1 of each pixel, the depletion layer it creates provides electrical isolation between the two adjacent pixels. Therefore, as is clearly seen in FIG. 6, the device of the present invention achieves good signal separation between adjacent pixels. In the experiment, the entire area of each pixel was exposed to light, so that the n$^-$ channel region 2 underlying the shielding gate 4-2 was also illuminated. However, as can be seen from FIG. 6, the resulting photocarriers were confined to the shielding gate of one pixel without drifting into the control gate 4-1 of the adjacent pixel. This is further evidence for the good signal separation between pixels attained by the invention.

Since any leaking carriers are absorbed by the shielding gate region, each two adjacent pixels are effectively isolated from each other. Obviously, this provides the semiconductor imaging device with an increased resistance to blooming. Since the shielding gate 4-2 surrounds the control gate 4-1 as shown in FIG. 4, excess photocarriers generated by intense light will be absorbed by the shielding gate without leaking into the adjacent pixel.

The measure for the resistance to blooming that is conventionally used with semiconductor imaging devices is the amount of light received by a particular pixel when 15% of the saturation current is leaking into the adjacent pixel. With the conventional MOS type semiconductor imaging device, the saturation exposure is 10 microwatts/cm$^2$, and about 20 times that amount will produce a leakage current amounting to 15% of the saturation level. This means that the index for the resistance to blooming of the conventional MOS type semiconductor imaging device is 200 microwatts/cm$^2$ (10 microwatts/cm$^2 \times$ 20). On the other hand, the saturation exposure for the pixels of the device of the present invention is about 100 microwatts/cm$^2$ (see FIG. 5), which is ten times greater as that for the MOS type semiconductor imaging device. Furthermore, the shielding gate 4-2 surrounds the control gate 4-1 and is common to a plurality of pixels. It was found experimentally that each pixel could receive an exposure far greater than a level 20 times the saturation exposure without causing blooming in the adjacent pixel. Therefore, in consideration of the high level of saturation current, it can be safely concluded that the semiconductor imaging device of the present invention has an index for resistance to blooming which is several decades higher than for the conventional MOS type semiconductor imaging device.

In order to confirm this observation, a semiconductor imaging device having pixels of the notched type (see FIG. 2) was subjected to an exposure test under the same conditions as used in obtaining the data shown in FIG. 6, except that the amounts of exposure were 100 microwatts/cm$^2$ (saturation exposure) and 10,000 microwatts/cm$^2$. The results are shown in FIG. 7, wherein curve A is a plot of the output voltage obtained when only the first pixel was illuminated with light, curve B traces the values obtained when only the second pixel was illuminated with light, and curve C is a plot of the values obtained when only the third pixel was illuminated. For each curve, the output voltages produced with the saturation exposure are indicated by circles, while those produced under illumination with 10,000 microwatts/cm$^2$ are indicated by triangles. As FIG. 7 shows, the pixels according to the present invention can receive an exposure 100 times as great as the saturation exposure without causing substantial effects on the adjacent pixels. Therefore, in the embodiment tested, the index for resistance to blooming is 10,000 microwatts/cm$^2$ (100 microwatts/cm$^2 \times$ 100). Since 100 microwatts/cm$^2$ is equivalent to an illumination of about 300 lux, the pixels of the present invention can withstand an illumination of 30,000 lux.

Figure 8:
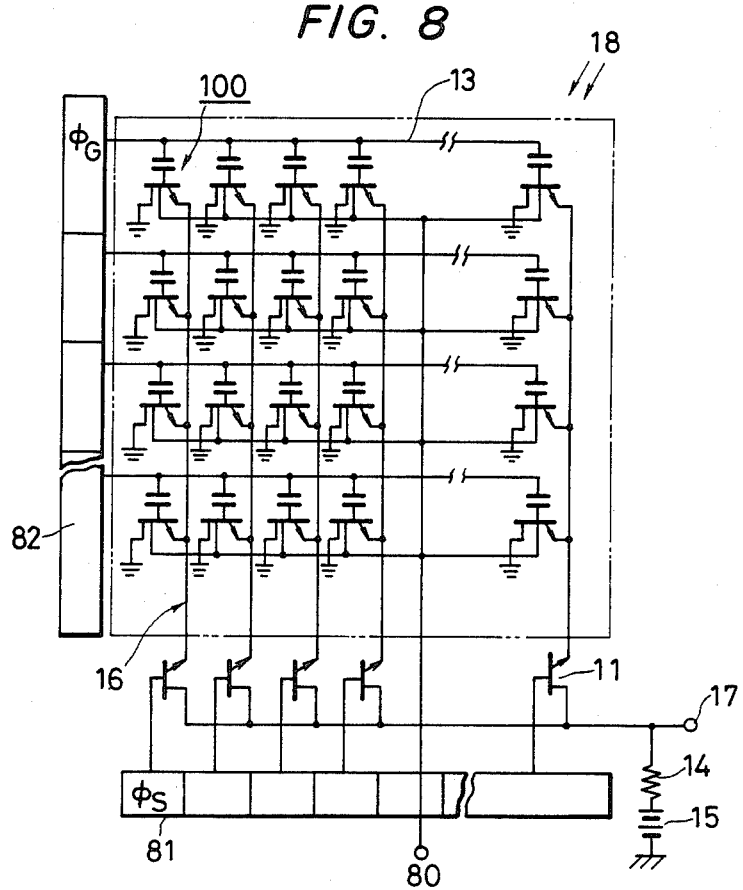
FIG. 8 is a circuit diagram of a semiconductor imaging device according to one embodiment of the present invention.

A circuit diagram of a semiconductor imaging device constructed by arranging the pixels of the present invention two-dimensionally is shown in FIG. 8. In FIG. 8, the shielding gate is common to all pixels 100. A terminal 80 may be floated. Alternatively, it may be grounded through a resistor or connected to a biasing circuit. Reference numeral 81 indicates a circuit for selecting the proper signal readout line 16, 82 is a circuit for selecting the proper signal readout line 16, and 82 is a circuit for selecting the proper selection line 13. The circuit 81 selects sequentially one of the switching transistors 11 in response to a pulse of the signal $\phi_S$ and causes the power source 15 to apply a bias voltage to the particusar signal readout line 16 through the load resistor 14. The circuit 82 causes the pulse signal $\phi_G$ to be applied to the proper selection line 13. By sequential selection of the pixels 100 arranged two-dimensionally, a two-dimensional video signal can be produced at the output terminal 17.

Figure 9A:
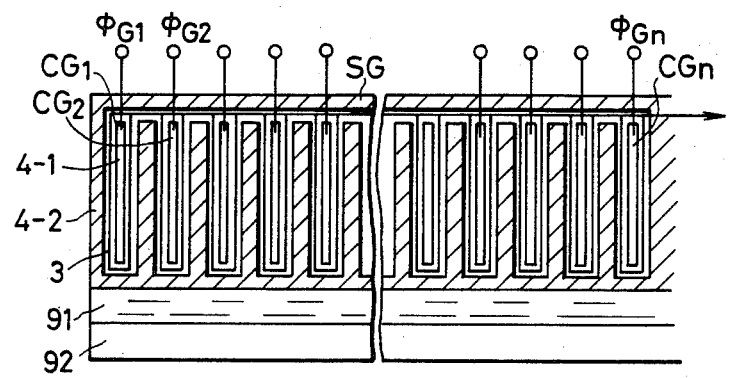
FIGS. 9A and 9B are, respectively, a plan view and a circuit diagram of another embodiment of an imaging device of the present invention.
Figure 9B:
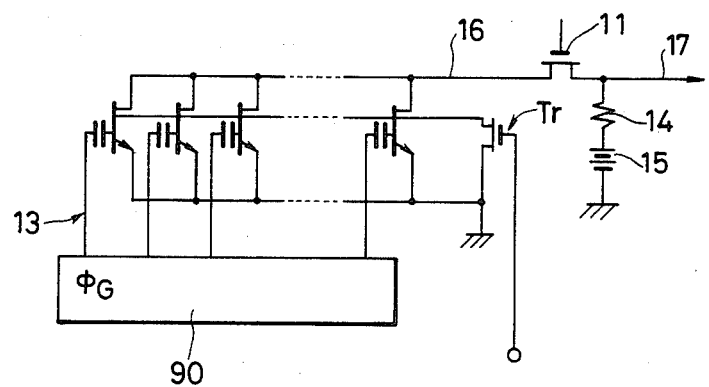

FIG. 9A is a plan view of the semiconductor imaging device of the present invention wherein pixels are arranged one-dimensionally. FIG. 9B shows an equivalent circuit of this line sensor. Again, the drain 3, source 1, and shielding gate 4-2 are common to all pixels, and the control gate 4-1 is the only electrical discrete element for each pixel 100. The control gates are connected to respective capacitors (FIG. 9B), which are sequentially selected by the selection circuit 90 for application of a pulse of the signal $\phi_G$.

An important feature of the illustrated embodiment is that an MOS transistor Tr having the shielding gate 4-2 as drain (the gate electrode is indicated at 91 and the source at 92 in FIG. 9A) is provided along the length of the line sensor. This transistor is capable of clearing the shielding gate of residual carrier (those left after the reading of the video signal) in a direction perpendicular to the longitudinal axis of the line sensor.

Figure 10:
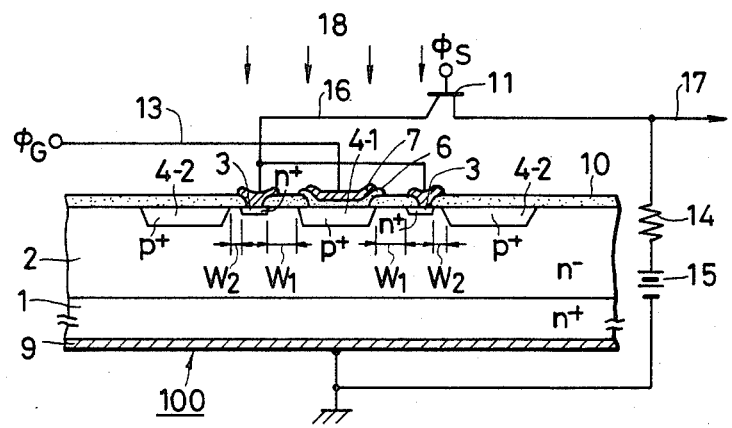

FIG. 10 shows another modification of the unit pixel used in the semiconductor imaging device of the present invention. In this modification, the drain region 3 is positioned in such a manner that the distance $W_2$ from the shielding gate region 4-2 is adequately smaller than the distance $W_1$ from the control gate region 4-1. Because of this positional relationship ($W_1$ is less than $W_2$), the depletion layer created by the control gate region is sufficiently expanded to ensure effective storage of photocarrriers in the control gate region.

Figure 11:
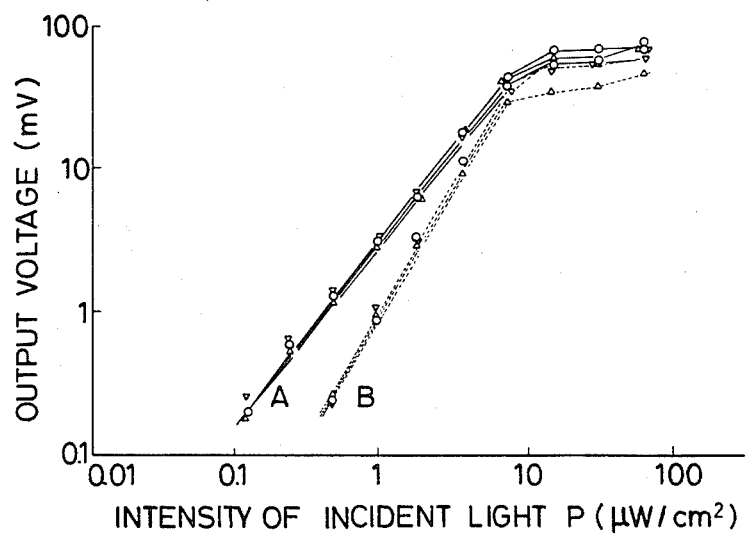
FIG. 11 is a graph showing the light intensity vs. output voltage characteristic of the pixel shown in FIG. 10.

FIG. 11 shows light intensity vs. output voltage curves for two different relations between $W_1$ and $W_2$. Curve A refers to $W_1-W_2=2$ microns and curve B refers to $W_1-W_2=1$ micron. As is clear from the graph of FIG. 11, when the drain region 3 comes adequately close to the shielding gate 4-2, photocarriers are effectively stored in the control gate 4-1.

According to still another modification of the pixel of the present invention, the depth of diffusion of impurities or the impurity concentration in the shielding gate may be varied with respect to the control gate. Details of a technique for carrying out such doing are to be found in Japanese Patent Application No. 157693/82 also filed by the present inventors.

The relation between the drain region 3 and source region 1 described above may be reversed and a bias may be applied from the power source 15 to the n+ substrate 1 through the load resistor 14. If desired, the conduction types of the respective regions in the semiconductor imaging device may also be reversed. In this latter case, a negative, rather than positive, voltage pulse must be applied to the selection line 13 and signal readout line 16, and electrons, rather than holes, are stored in the control gate region 4-1.

As described in detail above, the semiconductor imaging device of the present invention is composed of a linear (one-dimensional) arrangement or array (two-dimensional arrangement) of pixels, each composed of an SIT having drain and source regions, as well as control gate and shielding gate regions. The device is therefore characterized by a simple structure wherein one pixel consists of one transistor and yet is capable of producing a high signal output. Furthermore, the shielding gate is formed around the control gate and is common to all pixels. Accordingly, good signal separation can be achieved between respective pixels. An even greater signal output and higher resistance to blooming can be obtained by providing the drain (or source) region within the area defined by the control gate and shielding gate regions and along the entire length of the pixel, except for the area where the two gate regions are spaced by a greater distance than in other areas. (If the pixel is square, the areas to be excluded are in the vicinity of the four corners).

We claim:

1. A semiconductor imaging device comprising a plurality of pixels each comprising a static induction transistor comprising: a pair of principal electrode regions of one conduction type disposed facing each other through a channel region formed of high resistivity semiconductor material; first and second gate regions of the other conduction type, formed in contact with said channel region, for controlling current flow between said two principal electrode regions; and a gate electrode formed over at least part of said gate region and separated from said first gate region by a dielectric layer, a capacitor being defined by said gate electrode, said dielectric layer and said first gate region, so that carriers generated by light excitation are stored in said first gate region, wherein said second gate region is formed surrounding said first gate region and is common to all pixels; wherein said pair of principal electrode regions constitute the two principal electrodes of said transistor and said first and second gate regions jointly constitute the gate of said transistor.

2. The semiconductor imaging device according to claim 1, wherein said second gate region is formed in an area notched into said channel region.

3. The device according to claim 1, wherein one of said two principal electrode regions is disposed between said two gate regions and extends along the entire length of each pixel, except for an area where said two gate regions are spaced by a greater distance than in other areas and said second gate region substantially but not completely surrounds said first gate region and said one of said two principal electrode regions.

4. The semiconductor imaging device according to claim 1, wherein said pixels are arranged in a two-dimensional array.

5. The semiconductor imaging device according to claim 1, wherein said pixels are formed in a one-dimensional linear arrangement.

* * * * *